United States Patent
Kimoto

(10) Patent No.: US 7,573,281 B2
(45) Date of Patent: Aug. 11, 2009

(54) PROBE FOR INSPECTING ONE OR MORE SEMICONDUCTOR CHIPS

(76) Inventor: Gunsei Kimoto, 1-3-2-807, Daiba, Minato-ku, Tokyo (JP)

( * ) Notice: Subject to any disclaimer, the term of this patent is extended or adjusted under 35 U.S.C. 154(b) by 0 days.

(21) Appl. No.: 11/861,812

(22) Filed: Sep. 26, 2007

(65) Prior Publication Data

US 2008/0094090 A1 Apr. 24, 2008

(30) Foreign Application Priority Data

Oct. 18, 2006 (JP) ............................. 2006-309679
Nov. 13, 2006 (JP) ............................. 2006-333836

(51) Int. Cl.
*G01R 1/067* (2006.01)
(52) U.S. Cl. ....................... 324/762; 324/754
(58) Field of Classification Search ................. None
See application file for complete search history.

(56) References Cited

U.S. PATENT DOCUMENTS

| | | | |
|---|---|---|---|
| 5,355,080 A * | 10/1994 | Sato et al. | 324/761 |
| 6,443,784 B1 * | 9/2002 | Kimoto | 439/862 |
| 6,504,388 B2 * | 1/2003 | Comulada et al. | 324/754 |
| 7,432,727 B2 | 10/2008 | Kimoto | |
| 2005/0083072 A1 * | 4/2005 | Mori et al. | 324/754 |
| 2005/0253607 A1 | 11/2005 | Kimoto | |
| 2008/0174327 A1 | 7/2008 | Kimoto | |

FOREIGN PATENT DOCUMENTS

| | | |
|---|---|---|
| JP | 2004-274010 | 9/2004 |
| JP | 2005-300545 | 10/2005 |

* cited by examiner

*Primary Examiner*—Vinh P Nguyen
(74) *Attorney, Agent, or Firm*—Haynes and Boone, LLP

(57) ABSTRACT

A probe available for a narrow pitch pad without the need of cleaning is realized by providing a z deformed portion that is elastically deformed in a vertical direction, and a zθ deformed portion that is serially connected to the z deformed portion to rotate while being elastically deformed at least in the vertical direction. The zθ deformed portion has one or more rotation centers. The probe end has a curved surface in which the zθ deformed portion rotates about the rotation centers when coming into contact with the pad and during overdrive in the inspection, the probe end comes into contact with the pad surface at one point or within a certain range, a relative displacement occurs between the pad surface and the probe end, the contaminant material is removed in the beginning of the contact, and then electrical continuity is established in the second half of the contact.

7 Claims, 15 Drawing Sheets

PROBE FOR INSPECTING ONE OR MORE SEMICONDUCTOR CHIPS

CROSS REFERENCE TO RELATED APPLICATIONS

This application claims priority to Japanese patent application number 2006-309679, filed on Oct. 18, 2006, and Japanese patent application number 2006-333836, filed on Nov. 13, 2006, the disclosures of which are incorporated herein by reference.

BACKGROUND OF THE INVENTION

1. Field of the Invention

The present invention relates to a probe (a contact) of a prober device used for circuit inspection of plural semiconductor chips formed on a wafer in a production process of an electronic device such as LSI. More particularly, the present invention relates to a probe structure of a prober device used for a probing test that collectively measures electrical continuity of semiconductor chips by vertical probes brought into contact with circuit terminals (pads) arranged on the semiconductor chips in a wafer state.

2. Description of Prior Art

Along with the development of semiconductor technology, the integration degree of electronic devices is increasing. An area occupied by the circuit wiring is increasing in each semiconductor chip formed on a wafer and the number of circuit terminals (pads) on each semiconductor chip is also increasing. Under such circumstances, miniaturization of pad arrangement is pursued by reducing the pad area and narrowing the pad pitch, and the like. At the same time, a chip size package (CSP) is increasingly used where semiconductor chips are mounted as bear chips on a circuit board or other substrate, without being placed in a package. For this reason, it is inevitably necessary to check characteristics and determine quality in the wafer state before dividing into semiconductor chips.

An example of the semiconductor chip inspection method is that plural needle probes each having an elastically deformed portion that elastically deforms under an external force are arranged in area array to form a contact assembly, and then the contact assembly is interposed between pads of semiconductor chips to be inspected and an inspection apparatus. A printed wiring board called a probe card is used as means for electrically connecting the contact assembly and the inspection circuit of the semiconductor chips.

An issue arising out of the miniaturization of pad arrangement (narrowing of pitch) is that the probe structure needs to be made suitable for the miniaturization of pad arrangement to establish electrical continuity by bringing into contact with the pads of the semiconductor chips in the electrical characteristics test and circuit inspection of electronic devices. In order to address the increasingly miniaturized pad arrangement, various types of measurement methods are used.

An example of the probe structure is a needle probe having a cantilever structure. However, the cantilever structure has had the following problems. The pad is damaged as an end of the probe is displaced in the horizontal direction when coming into contact with the pad, and the measurement yield decreases as the end deviates from the pad. There has been another problem that it is difficult to control the contact pressure to be constant due to variation of the fitting accuracy of each probe.

In a vertical probe replacing the cantilever structure, more specifically, in a vertical probe that is vertically fixed to a circuit terminal of a probe card, it is necessary to configure that the pad pitch on the semiconductor chip and the circuit terminal pitch on the probe card have the same pitch interval. However, there is technical limitation to miniaturization of the circuit pattern on the probe card which is the printed wiring board. Thus, it is difficult to meet the requirement of matching the pad pitch in relation to the area occupied by the circuit terminals and to the wiring width. Further, the pitch interval available for soldering is also limited, so that it has not been possible to vertically fix the vertical probe to the probe card in line with the pad pitch of the semiconductor chip as the miniaturization has progressed. There has been another problem that a scrubbing function described below is not operated.

A pad of an IC chip to be inspected is generally formed by an aluminum alloy film or a gold plate. The surface of the pad is covered with an oxide film or other material. In order to establish stable electrical continuity between the probe and the pad, the vertical probe has a function that, upon contact of the end of the probe with the pad, as shown in FIG. 14A described below, the probe pin end is pressed (overdriven) by a certain distance in the vertical direction after coming into contact with the pad, while rubbing (scrubbing) the surface of the pad in the horizontal direction to destroy the oxide film or other material.

In order to realize the requirement of the probe pin structure as described above, namely, in order to adapt to the miniaturization of pad arrangement and the narrowing of pitch as well as to realize precise control of behavior in the vicinity of the contact portion of the probe including overdrive and scrubbing functions, the inventors have made the following proposition.

A conventional example proposed by the inventors will be described with reference to FIGS. 14A to 14C. FIGS. 14A to 14C are views illustrating a probe in the cantilever structure and parallel spring structure according to the conventional invention. FIGS. 14A, 14B, 14C are views showing the movement of the end portion of each probe. Incidentally, the end of the probe is kept vertical until coming into contact with a pad portion of a semiconductor chip and the like.

In FIG. 14A, a vertical probe 202a is attached to an end portion of a cantilever 201 having a length L. The vertical probe 202a has an end portion vertically facing an upper surface of a pad 203 of a semiconductor chip and the like, and the other end horizontally attached to a support portion 204. Next, when the pad 203 is raised or the support portion 204 is lowered for inspection, the end portion of the vertical probe 202a and the upper surface of the pad 203 come into contact with each other. The cantilever 201 of the length L is rotated about a calculated position of approximately (⅓) L. The end portion of the vertical probe 202a largely moves by a distance d0 while contacting the upper surface of the pad 203. As a result, particularly for miniaturized pads, the end portion of the vertical probe 202a deviates from the pad portion 203, and so the measurement may be disabled. Further, the upper surface of the pad 203 may be scratched or damaged when a large pushing pressure is applied to the vertical probe end, which would lead to the decrease of the yield of the assembly and testing process such as wire bonding.

In order to eliminate such negative effects, as shown in FIG. 14B, the cantilever 201 has a link structure of a parallel spring 205 in which a vertical probe 202b is provided at an end of the link 205. With such a link structure, when a contact load is applied to the vertical probe 202b in the same vertical direction as shown in FIG. 14A, the move distance d1 of the end portion of the vertical probe 202b is d1<d0. Thus the move distance can be limited to a very small amount due to the link structure.

The parallel spring is formed by plural beams having substantially the same shape and being arranged parallel to each other. The plural beams are fixed at both ends thereof to common deformable supports. When the support on one side is fixed and the support on the other side is moved, the beams perform translation movement within a certain range.

FIG. 14C shows a link structure in which the shape of the parallel spring 205 forming the cantilever is deformed in advance. The move distance d2 of the end portion of the vertical probe 202c is d2<d0. Thus the move distance can also be limited to a very small amount.

As described above, the precise control of behavior has been made possible in the vicinity of the contact portion between the pad and the probe, by employing the probe structure of the parallel spring structure instead of the cantilever structure used in the past, and by selecting the shape, size, material, and the like.

A conventional example using the parallel spring will be described with reference to FIGS. 15A to 15C. FIGS. 15A, 15B, 15C are views respectively showing the relationship between the pad and the end portion of the probe using the parallel spring. In FIG. 15A, the parallel beams of the probe are in a horizontal state until the pad 213 relatively moves in the vertical direction and comes into contact with the end portion of the vertical probe 212. Next, as shown in FIG. 15B, the pad starts to come into contact with the end portion of the vertical probe 212. When a movement is applied to pushup the probe in the vertical direction by a certain amount, namely, when overdrive is applied to the probe, two parallel beams 211a, 211b of the probe rotate and move substantially in parallel to each other. Along with this, the vertical probe 212 moves in the vertical direction. At this time, the vertical probe 212 moves in the vertical direction while moving in the horizontal direction along the contact surface of the pad 213 by the distance d1. The move distance can be set to a value sufficiently smaller than the move distance of the end of the vertical probe having the cantilever structure used in the past as shown in FIG. 14A, thereby preventing the probe end from deviating from the pad 213. The oxidized film or other material existing on the surface of the pad 213 is destroyed by the horizontal movement of the probe contact end. In this way, stable electrical continuity can be established between the probe 212 and the pad 213. After the inspection is completed, as shown in FIG. 15C, the pad and the probe are released from the pushing pressure and returned to their original state.

Problems to be Solved by the Invention

As described above, the oxidized film or other material is removed from the pad surface by the overdrive and scrubbing movements, so that stable electrical continuity can be established between the probe and the pad. However, in FIG. 15C, when the oxidized film or other material removed from the pad surface is kept attached to the end portion 212c of the vertical probe 212, electrical continuity between the probe and the pad is prevented in the next inspection and stable electrical continuity is not established between the pad and the probe. In order to address this problem, it is necessary to frequently clean the probe pin end by polishing or other means to remove the material adhering to the probe pin end. This has lead to a cost increase due to the interruption of the inspection process caused by cleaning, the reduction of the probe life, or other factors.

The present invention is made to solve such problems, and a first object thereof is to provide a probe whose performance is easily maintained without the need to frequently clean the probe end.

A second object of the present invention is to provide a probe capable of being adapted to the miniaturization of pad arrangement and to the narrowing of pitch.

A third object of the present invention is to provide a probe capable of providing a precise control of behavior in the vicinity of the contact portion of the probe including overdrive and scrubbing functions.

SUMMARY OF THE INVENTION

According to the present invention, a probe includes a z deformed portion that is elastically deformed in the vertical direction, and a zθ deformed portion that is serially connected to the z deformed portion to rotate while being elastically deformed in the vertical direction. This configuration makes it possible to set the rotation center of the probe near the end of the probe, and to independently design the necessary amount of overdrive, the small amount of horizontal movement of the probe end, the movement of which should be limited within the pad surface, and the scrubbing movement on the pad surface, respectively.

Further, according to the present invention, in the probe configuration as described above, the zθ deformed portion has one or more rotation centers and a curved portion. The zθ deformed portion rotates about the rotation centers when coming into contact with the pad and during overdrive in the inspection. When the probe end comes into contact with the pad surface at one point or within a limited range, a relative displacement occurs between the pad surface and the probe end. The contaminant material is removed in the beginning of the contact, and then electrical continuity is established in the second half of the contact. Thus, in the probe according to the present invention, the cleaning process of the probe end is eliminated in a circuit inspection apparatus (prober) that is adapted to the narrowing of pitch of semiconductor devices.

Further, according to the present invention, plural probe output terminals are arranged on a straight line and connected to a first wiring group. The output terminals of plural first wiring groups are arranged on a straight line and connected to a second wiring group. With such a configuration, the terminals of the first and second wiring groups can establish electrical continuity only by contact with each other, eliminating the need to perform soldering and thereby facilitating the maintenance operation.

The above described effects and other effects will become more apparent by the following description with reference to the accompanying drawings.

DETAILED DESCRIPTION OF THE PREFERRED EMBODIMENTS

Hereinafter preferred embodiments of the present invention will be described with reference to the accompanying drawings. It is to be noted that the present invention is not limited to such embodiments.

First Embodiment

Figure 1A:
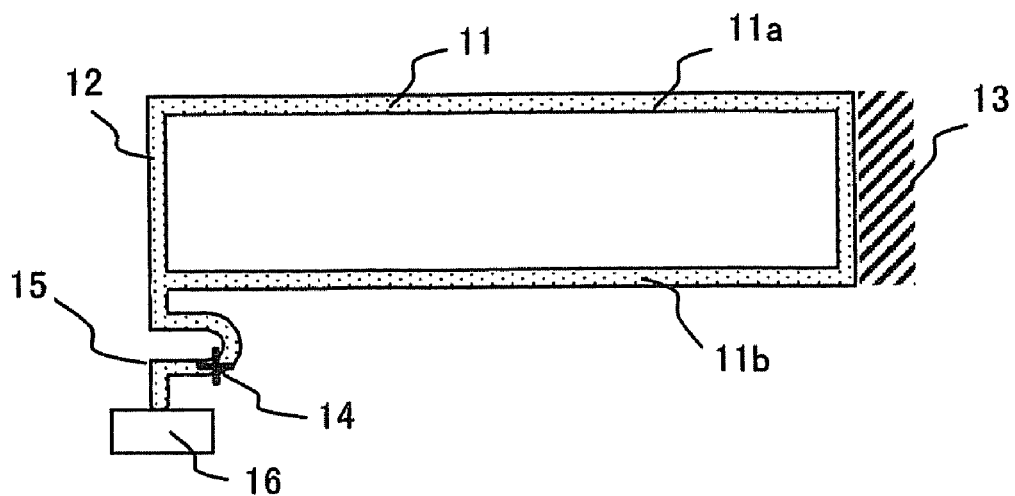
FIGS. 1A, 1B are views illustrating a probe structure as a first embodiment of the present invention, respectively showing the movement of a probe end portion.
Figure 1B:
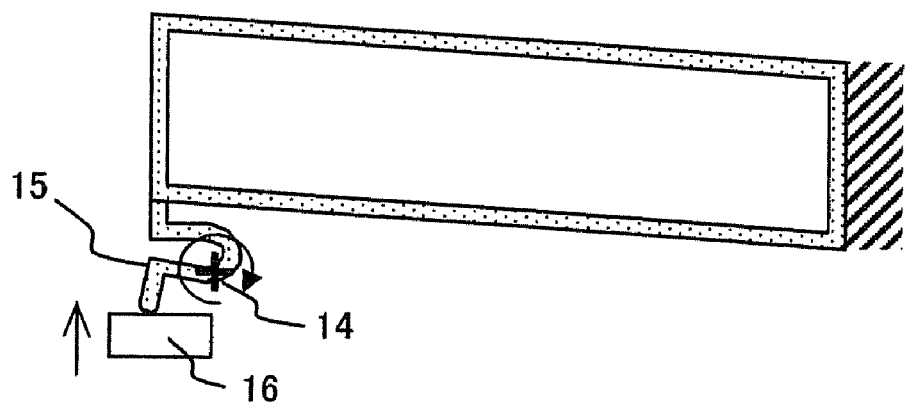
Figure 2:
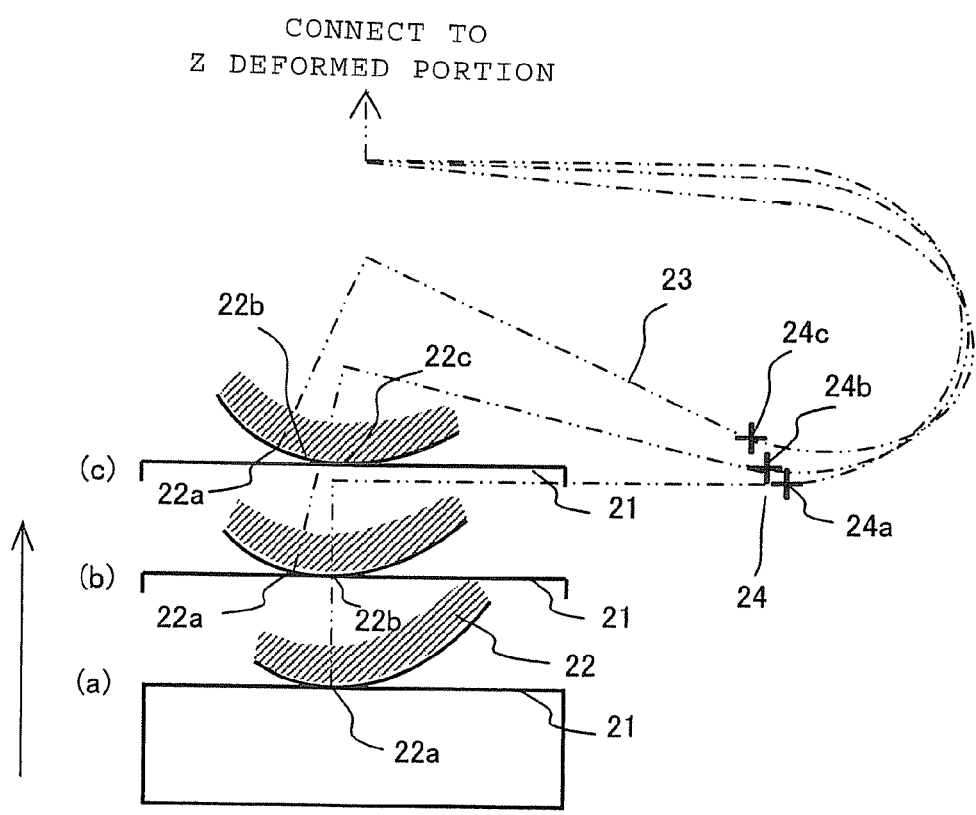
FIGS. 2A, 2B, 2C are partially enlarged views of a zθ deformed portion to illustrate the first embodiment of the present invention, respectively showing the trajectories of the probe end portion and the center line.

Hereinafter an embodiment of the present invention will be described with reference to the accompanying drawings. FIGS. 1A, 1B are views illustrating a probe structure according to an embodiment of the present invention, respectively showing the movement of a probe. Incidentally, an end of a vertical probe is kept vertical until coming into contact with a pad portion of a semiconductor chip and the like. FIGS. 2A, 2B, 2C are schematic views showing the detailed movement of a zθ deformed portion.

In FIG. 1A, the probe has a link structure of a parallel spring 11 with an end 13 as a fixed end, which forms a z deformed portion. A zθ deformed portion 15 having a rotation center 14 is serially connected to a vertical probe portion 12 of the link 11. One end of the zθ deformed portion 15 comes into contact with a surface of a pad 16, and then electrical continuity with the pad is established. In the embodiment, the zθ deformed portion 15 has a U-shape.

In FIG. 1A, the parallel beam portion 11 of the probe is kept horizontal until the pad 16 relatively moves in the vertical direction and comes into contact with the end portion of the probe 12. Next, as shown in FIG. 1B, when the pad 16 starts to come into contact with the end portion of the vertical probe 12 and when overdrive is applied to push up the probe in the vertical direction by a certain amount, two parallel beams 11a, 11b of the probe rotate and move substantially in parallel to each other. Along with this, the vertical probe 12 moves in the vertical direction. At this time, the vertical probe 12 moves in the vertical direction while moving in the horizontal direction by a small distance. The movement distance can be arbitrary set by selecting the length, thickness, opening area of the beams in the parallel spring as well as by selecting the spring constant of the material.

The zθ deformed portion 15 moves in the vertical and horizontal directions along with the movement of the vertical probe 12, and starts a clockwise rotational movement about the rotation center 14 as the overdrive progresses. The movement of the zθ deformed portion 15 at this time will be described in detail with reference to FIGS. 2A, 2B, 2C.

FIGS. 2A, 2B, 2C are views showing the vicinity of the contact portion of the zθ deformed portion 15 with the pad, and the trajectory of the center line of the zθ deformed portion 15, in three stages according to the progress of the overdrive. Here, the movement of the z deformed portion (not shown) is fixed. In FIGS. 2A, 2B, 2C, reference numeral 22 denotes a partial shape of the probe end in the vicinity of the contact portion with a pad surface 21, and reference numeral 23 denotes a center line of the zθ deformed portion 15. FIG. 2A is a view showing the start of the contact with the pad 21, in which the probe end 22 comes into contact with the pad 21 at a position 22a. When the overdrive progresses and the pad 21 pushes up the probe 22 to the state of FIG. 2B, a rotational movement about the rotation center 24 is applied to the end portion of the zθ deformed portion 15. As a result, the contact point of the probe end and the pad moves from 22a to 22b. When the overdrive further progresses and the pad 21 pushes up the probe 22 to the state of FIG. 2C, the rotational movement also progresses and the contact point with the pad moves from 22b to 22c. At this time, the rotation center is changed from 24a to 24b, and to 24c as the overdrive progresses. Further, displacement of the z deformed portion, which is not shown in the figure, is added thereto.

In the series of movements, a relative displacement occurs in the pad surface 21 and the probe end 22 due to a rubbing (scrubbing) movement. This makes it possible to remove the oxidized film in the beginning of the contact, for example, in the transition from 22a to 22b, and to establish electrical continuity in the second half of the contact, for example, in the transition from 22b to 22c. With this movement, even if the oxidized film or other contaminant material adheres to the probe end when the pad and the probe are released from the pushing pressure and are returned to the original state after completion of the inspection, the oxidized film or other contaminant material can typically be removed by repeating the same rubbing movement in the next inspection. Thus, it is possible to realize a probe structure in which cleaning is not necessary.

Figure 3:
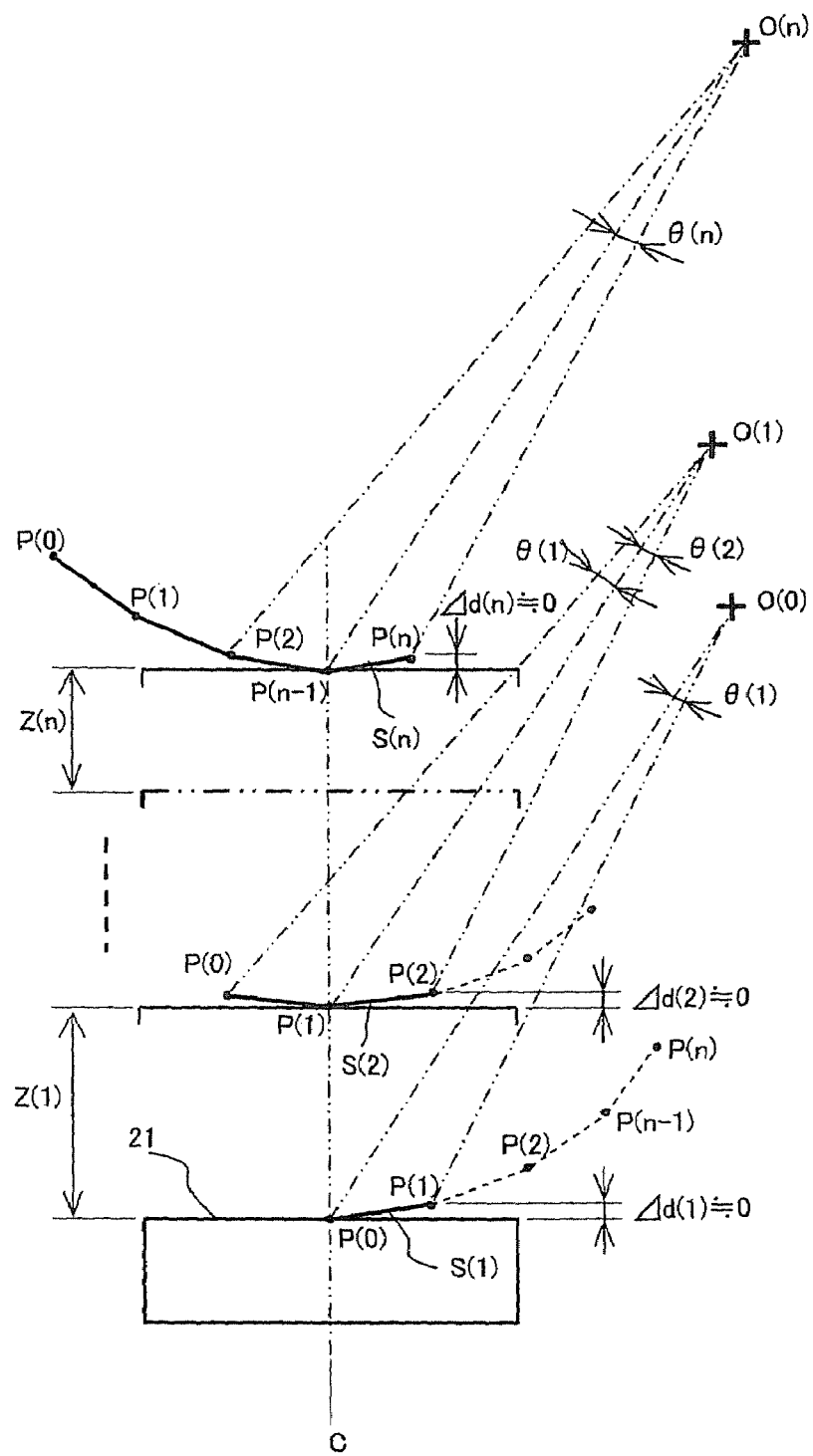
FIG. 3 is a schematic side view illustrating a production method of a probe contact surface shape of the zθ deformed portion, showing the first embodiment of the present invention.

Referring to FIG. 3, description will be made on a production method of the probe contact surface shape to efficiently generate the above-described scrubbing movement between the pad surface 21 and the probe end 22. In FIG. 3, there is shown a rotation angle θ made by the probe end 22 from the start of the scrubbing movement relative to the pad surface 21 until the end of the scrubbing movement. The rotation angle θ is divided into n small angles θ(1), θ(2), and θ(n). The rotation centers corresponding to respective rotations are represented by O(0), O(1), and O(n). The z direction displacements corresponding to the respective rotations, namely, the elements of overdrive are represented by Z(1) Z(2), and Z(n).

Assuming that P(0) is a contact point where the probe comes into contact with the pad and starts scrubbing, the rotation center moves from O(0) to O(1) along with the displacement of the first overdrive Z(1), while the probe rotates at the first small rotation angle θ(1). The contact point after the rotation is represented by P(1), and a first line segment between the contact points P(0) and P(1) is represented by S(1). The P(1) is set so that an inclination Δd(1) of the first line segment S(1) relative to the first small rotation angle θ(1) is substantially 0 degree, namely, so that S(1) is substantially parallel to the pad surface. The rotation center O(0) at the start of the scrubbing movement is provided on a trajectory of contact points between the probe and the pad, namely, on the right side sufficiently apart from a vertical line C passing through the contact point P(0). With such a configuration, when the pad relatively moves by the first overdrive Z(1) corresponding to the first small rotation angle θ(1), the rotational movement is applied to the probe end, and then the contact point between the probe and the pad frictionally moves from P(0) to P(1).

Similarly, the rotation center moves from O(1) to O(2) (not shown) along with the displacement of a second overdrive Z(2) (not shown), while the probe rotates at the second small rotation angle θ(2). The contact point after the rotation is represented by P(2), and a second line segment between the contact points P(1) and P(2) is represented by S(2). The P(2) is set so that an inclination Δd(2) of the second line segment S(2) is substantially 0 degree. With such a configuration, when the pad moves by the second overdrive Z(2) corresponding to the second small rotation angle θ(2), the rotational movement is further applied to the probe end. As a result, the contact point between the probe and the pad moves from P(1) to P(2).

This will be described using a regular expression in a case in which the rotation is divided into n parts. The rotation center moves from O(n−1) to O(n) along with the displacement of the n-th overdrive element Z(n), while the probe rotates at the n-th small rotation angle θ(n). The contact point after the rotation is represented by P(n), and the n-th line segment between the contact points P(n−1) and P(n) is represented by S(n). The P(n) is set so that the inclination Δd (n) of the n-th line segment S(n) is substantially 0 degree. With such a configuration, when the pad moves by the n-th overdrive element Z(n) corresponding to the n-th small rotation angle θ(n), the rotational movement is applied to the probe end. As a result, the contact point between the probe and the pad moves from P(n−1) to P(n).

As described above, the positions of the contact points P(1) to P(n) are determined so that the rotational movement is applied to all the n contact points P(1) to P(n) in relation to the overdrive elements Z(1), Z(2), and Z(n). The contact points P(0), P(1), and P(n) are connected by a continuous smooth curve to form a convex curve. The end shape of the probe to come into contact with the pad can be determined in this way. With the shape determined as described above, the probe end comes into contact with the pad surface at one point or within a limited range on the pad surface, and relative displacement occurs in the pad surface and the probe end. This makes it possible to remove the contaminant material in the beginning of the contact and to establish electrical continuity in the second half of the contact.

Second Embodiment

As a second embodiment, there is shown an embodiment in which the present invention is applied to a probe structure by film lamination which has already been proposed by the inventors. The probe structure by film lamination proposed by the inventors, as shown in FIG. 24 of JP-A No. 274010/2004 or in FIG. 1 and other figures of JP-A No. 300545/2005, is formed by attaching a copper thin plate to a surface of a ribbon-like (strip-like) resin film, forming a copper probe having a curved portion on the resin film surface by etching the copper thin plate, and laminating plural sheets of the resin film in which the probe is formed.

Figure 4:
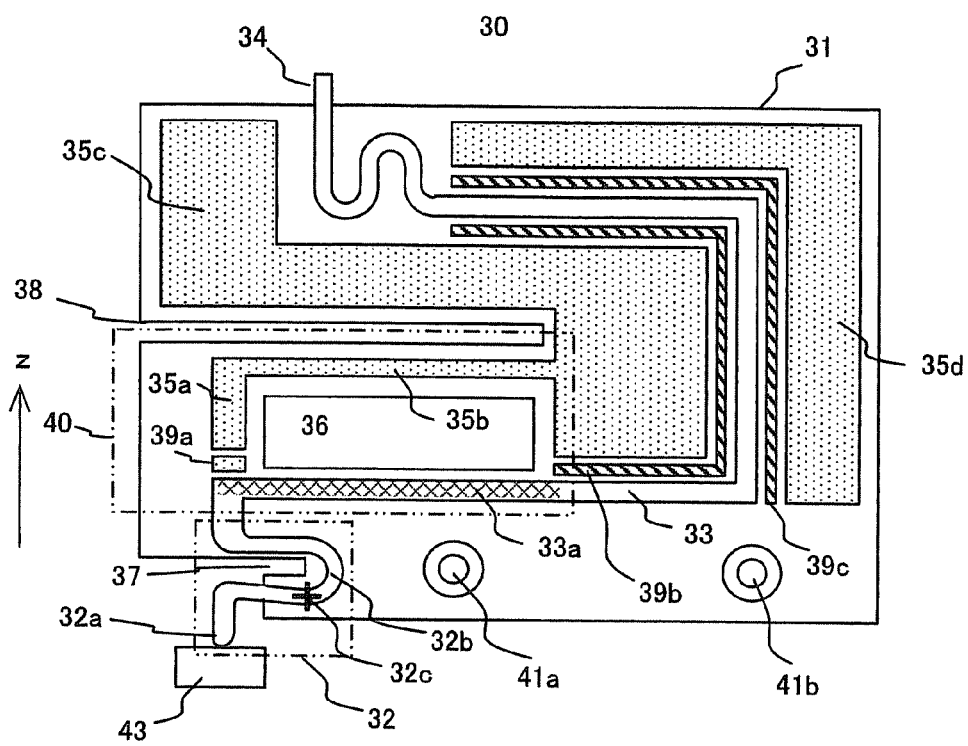
FIG. 4 is a schematic side view of a film-laminated type probe, showing a second embodiment of the present invention.

FIG. 4 shows an embodiment with the film-laminated type probe structure. In FIG. 4, a Zθ deformed potion 32, a conductive portion 33, a signal line terminal portion 34, and enhanced conductive dummy portions 35a, 35b, 35c, 35d are all formed by attaching copper foil (e.g., beryllium copper) onto a resin film (e.g., polyimide resin) 31 and by etching the copper foil. Further, insulating dummy portions 39a, 39b, 39c are formed by printing insulating resin in spaces between the conductive portion 33 and the enhanced conductive dummy portions 35a, 35b, 35c, 35d. The resin film 31 has an opening 36 and cuts 37, 38 in advance.

Referring to the drawings, description will be made on the function and movement in a film-laminated type probe 30 configured as described above. In an end of the conductive portion 33 for transmitting an inspection signal, a zθ deformed portion 32 is formed by a probe end portion 32a and a curved portion 32b. Because the cut 37 is provided, the probe end portion 32a starts rotating about a rotation center 32c when the contact with a pad 43 starts and as the pushing pressure progresses. Because the opening 36 and the cut 38 are provided, a parallel beam 33a of the conductive portion, the enhanced conductive dummy portions 35a, 35b, and the insulating dummy portion 39a all form a parallel spring portion, namely, a z deformed portion 40. As the pushing pressure with the pad 43 progresses, the deformation in the z direction is started with the rigid portions, mainly the enhanced conductive dummy portions 35c and 35d, as the fixed ends. The signal line terminal portion 34 is provided in the other end of the conductive portion 33 to output the inspection signal to a printed-wiring board or other substrate of an inspection apparatus.

The film-laminated type probe 30 is designed to be available for inspection of high frequency devices, by not only reducing the capacitance of the signal conductive portion by electrically connecting the enhanced conductive dummy portions 35a, 35b, 35c, 35d to earth, but also providing a magnetic shielding function. At the same time, the film-laminated type probe 30 has a function for increasing the rigidity of the resin film, together with the insulating dummy portions 39a, 39b, 39c in which the insulating resin is printed, thereby preventing deformation due to buckling or other damage.

Figure 5:
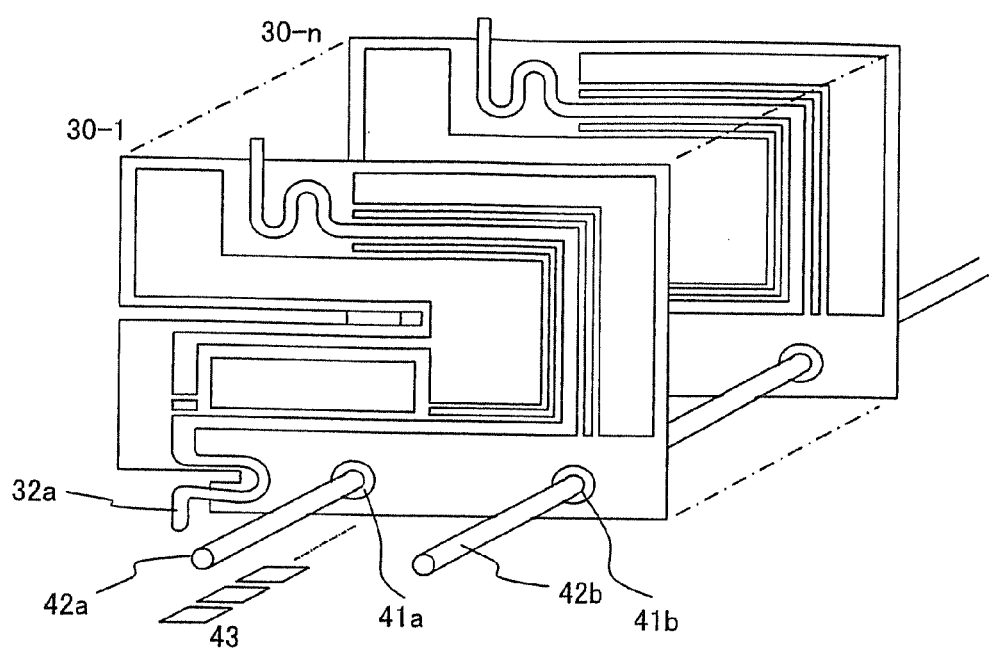
FIG. 5 is a general assembly view of the film-laminated type probe, showing the second embodiment of the present invention.

FIG. 5 shows a probe assembly in which n sheets of the film-laminated type probe 30 are laminated. The film-laminated type probe 30 has holes 41a, 41b through which support rods 42a, 42b pass to laminate and fix the n sheets of the film-laminated type probe 30. With such a configuration, it is possible to simultaneously inspect n pads of a pitch corresponding to the film thickness (several tens μm). Further, it is possible to apply to the pads arranged in a zigzag pattern or other non-grid pattern by individually setting the wiring pattern, the position of the probe end portion 32a, and the position of the signal line terminal portion 34. It is also possible to set the positions of the signal line terminal portions in line with the positions of the signal input/output terminals of the printed-wiring board of the inspection apparatus.

Third Embodiment

Figure 6A:
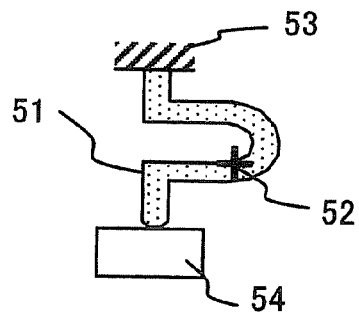
FIGS. 6A, 6B are views illustrating a third embodiment of the present invention, respectively showing the movement of the probe end portion.
Figure 6B:
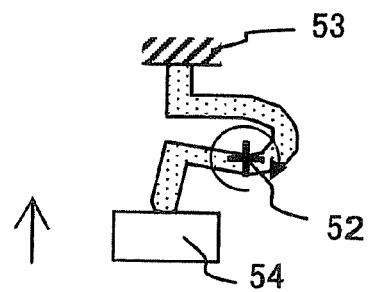

FIGS. 6A, 6B are views illustrating a probe structure which is a third embodiment. In FIGS. 6A, 6B, reference numeral 51 denotes a probe formed only by the zθ deformed portion in FIG. 1. An end of the zθ deformed portion is supported by a fixed end 53, and the probe itself does not move in the z direction. FIG. 6A is a view showing the start of the contact with a pad 54, in which the end of the probe 51 comes into contact with the pad 54. When the overdrive progresses and the pad 54 pushes up the probe 51 to the state of FIG. 6B, a rotational movement about a rotation center 52 is applied to the probe end portion which is the zθ deformed portion. The surface of the pad 54 is rubbed by the movement shown in FIG. 2, and thereby electrical continuity with the pad is established.

Fourth Embodiment

Figure 7A:
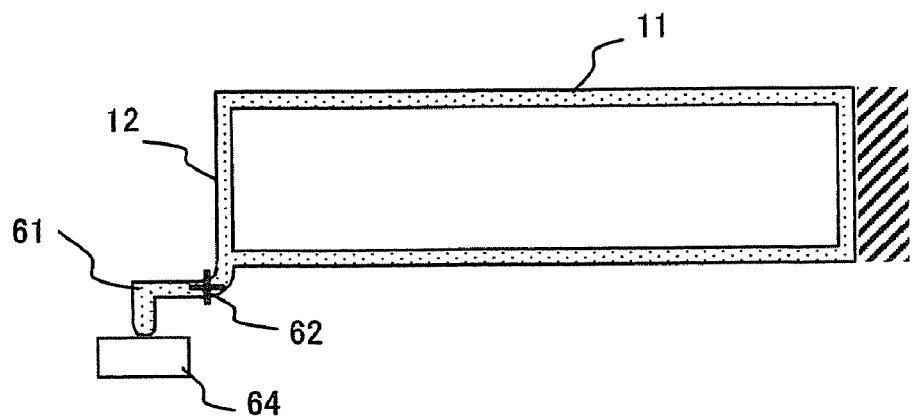
FIGS. 7A, 7B are views illustrating a fourth embodiment of the present invention, respectively showing the movement of the probe end portion.
Figure 7B:
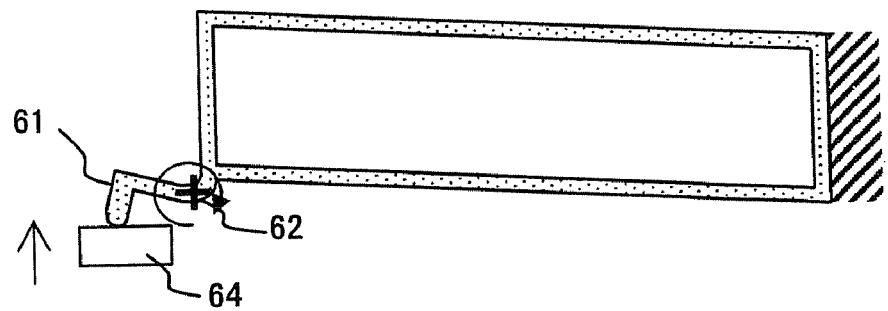

FIGS. 7A, 7B are views illustrating a probe structure which is a fourth embodiment. In FIGS. 7A, 7B, reference numeral 61 denotes a zθ deformed portion serially connected to the vertical probe portion 12 of the parallel spring 11 in FIG. 1. The zθ deformed portion 61 is a cantilever structure with one end supported by the vertical probe portion 12. FIG. 7A is a view showing the start of the contact with a pad 64, in which the end of the probe comes into contact with the pad 64. When the overdrive progresses and the pad 64 pushes up the probe to the state of FIG. 7B, the parallel spring 11 is displaced in the z direction and a rotational movement about a rotation center 62 is applied to the zθ deformed portion 61. The surface of the pad 64 is rubbed by the movement shown in FIG. 2, and thereby electrical continuity with the pad is established.

Fifth Embodiment

Figure 8A:
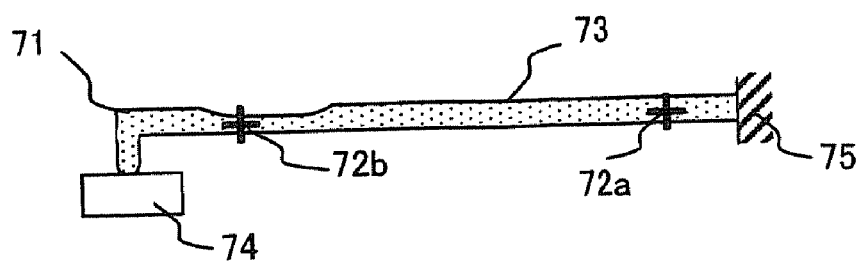
FIGS. 8A, 8B are views illustrating a fifth embodiment of the present invention, respectively showing the movement of the probe end portion.
Figure 8B:
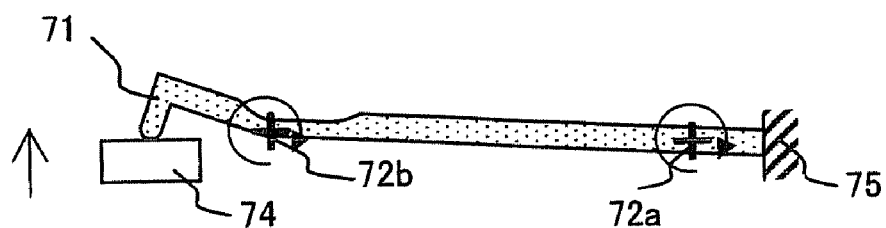

FIGS. 8A, 8B are views illustrating a probe structure which is a fifth embodiment. In FIGS. 8A, 8B, a probe 73 has one end supported by a fixed end 75 and is formed only by the cantilever structure rotating about a first rotation center 72a. The end portion of the probe 73 has a zθ deformed portion 71 rotating about a second rotation center 72b. FIG. 8A is a view showing the start of the contact with a pad 74, in which the end of the zθ deformed portion 71 comes into contact with the pad 74. When the overdrive progresses and the pad 74 pushes up the probe 73 to the state of FIG. 8B, the probe 73 rotates about the rotation center 72a, while the zθ deformed portion rotates about the rotation center 72b. In this way, electrical continuity with the pad is established by the movement shown in FIG. 2.

The present embodiment is an example in which the beam length of the cantilever is relatively long. However, when the beam length is sufficiently short, the rotation centers 72a and 72b may be the same position.

Sixth Embodiment

Figure 9A:
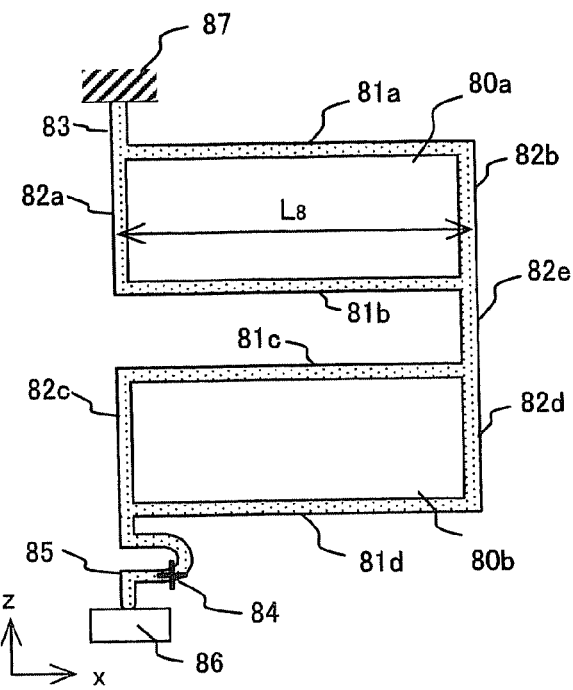
FIGS. 9A, 9B are views illustrating a sixth embodiment of the present invention, respectively showing the movement of the probe end portion.
Figure 9B:
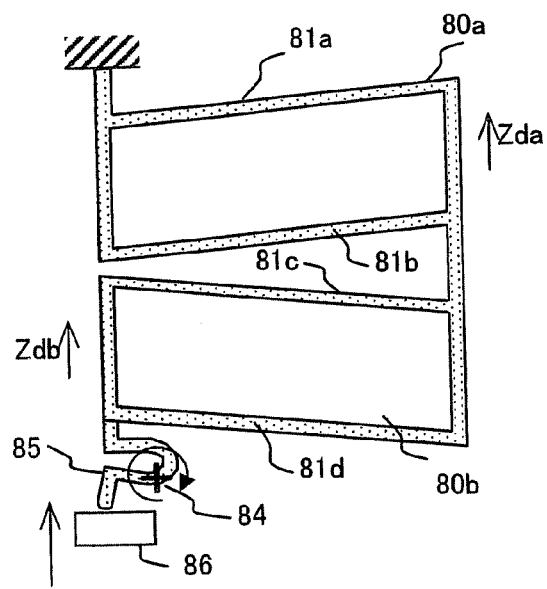

FIGS. 9A, 9B are views illustrating a sixth embodiment, respectively showing the basic structure of a probe and the movement of the end portion thereof. In FIG. 9A, a first parallel spring 80a is formed by parallel beams 81a and 81b of an electrically conductive material having a length L8, and by vertical beams 82a and 82b which are undeformable supports. Similarly a second parallel spring 80b is formed by parallel beams 81c and 81d of the electrically conductive material having the length L8, and by vertical beams 82c and 82d which are undeformable supports. The first and second parallel springs 80a, 80b are connected between the vertical beams 82b, 82d by an undeformable vertical beam 82e of the electrically conductive material. Further, the other vertical beam 82a of the first parallel spring 80a is linked to a signal terminal portion 83 to be connected to an inspection circuit pad 87 which is assumed as a fixed end in the probe structure. The other vertical beam 82c of the second parallel spring 80b is connected to a zθ deformed portion 85.

In FIG. 9A, with the inspection circuit pad 87 as the fixed end, the parallel beams 81a to 81d of the probe are kept horizontal until the pad 86 to be inspected moves in the z direction and comes into contact with the end of the zθ deformed portion 85 of the probe. Next, as shown in FIG. 9B, when the pad 86 starts to come into contact with the probe end portion and the overdrive is applied thereto, the pairs of the parallel beams 81a, 81b and 81c, 81d of the two parallel springs 80a, 80b rotate and move substantially parallel in the direction shown in the figure. Along with this, the probe end portion moves in the z direction.

The zθ deformed portion 85 moves in the vertical and horizontal directions along with the movement of the parallel springs 80a and 80b, while starting a clockwise rotational movement about the rotation center 84 as the overdrive progresses.

By employing the parallel spring configured in two stages as described in the embodiment, even if the length L8 of the parallel beam is shortened, a relatively large amount of overdrive can be obtained as the z direction movements Zda and Zdb of the first and second vertical beams are added, respectively. Thus, it is possible to realize a probe that can be placed in a small space in the x direction, for example, in a space corresponding to the area of one LSI chip. As a result, it is possible to configure a group of probes available for all pads of one LSI chip within the area of one LSI chip.

Seventh Embodiment

Figure 10:
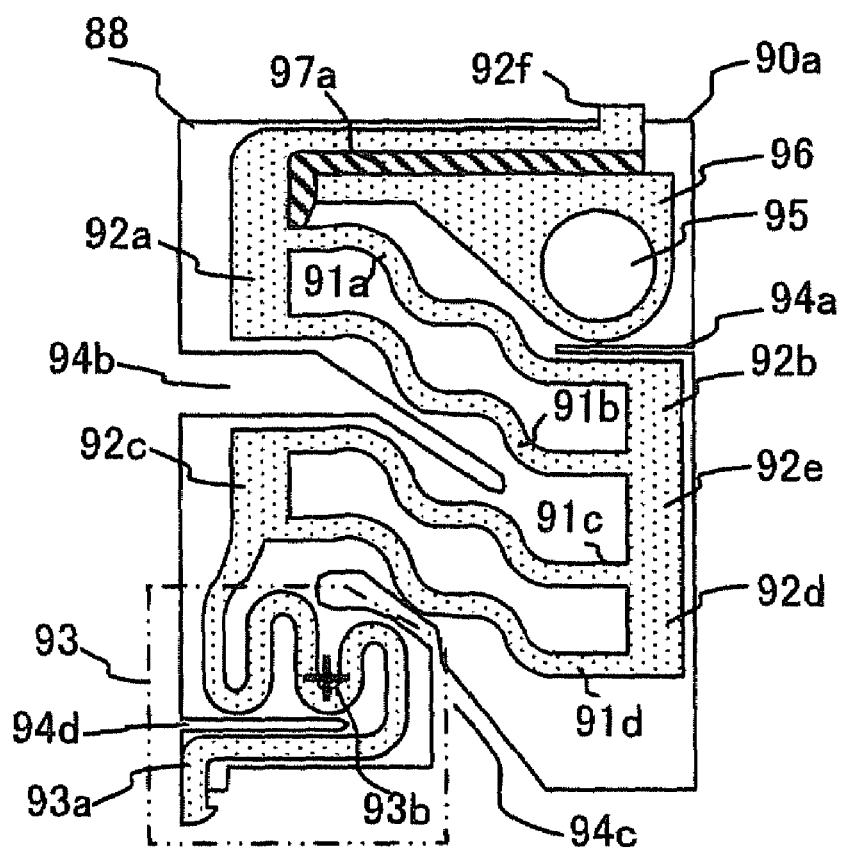
FIG. 10 is a view illustrating a seventh embodiment of the present invention, which is a schematic side view of the film-laminated type probe.
Figure 11:
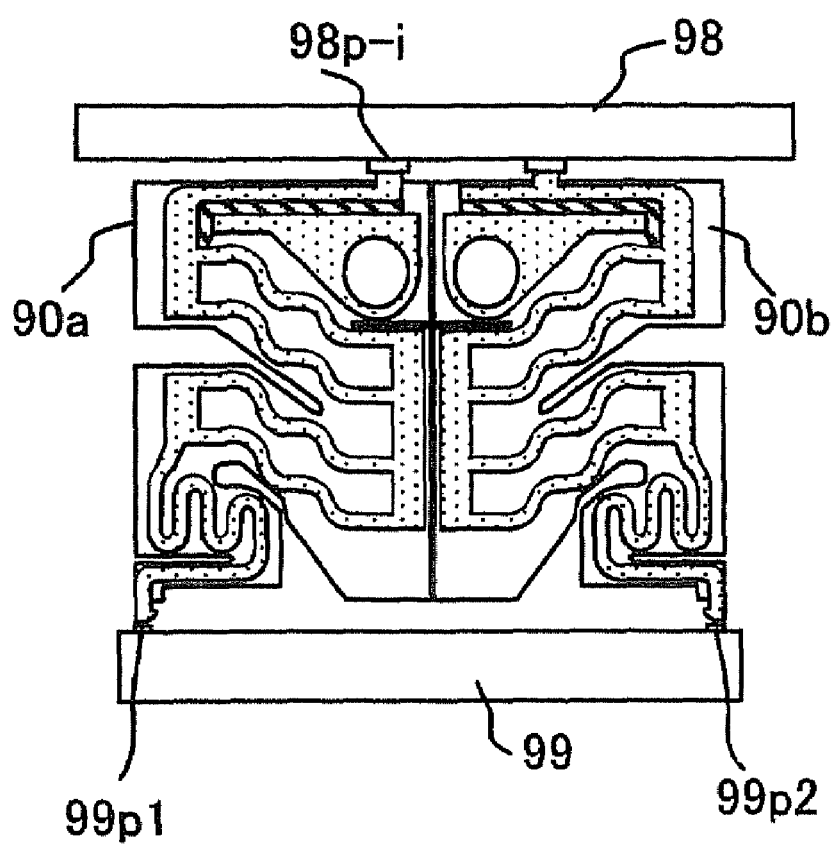
FIG. 11 is a schematic side view showing a configuration in which the film-laminated type probe shown in FIG. 10, and the other film-laminated type probe configured in a symmetrical fashion, are provided in pairs in the seventh embodiment of the present invention.
Figure 12:
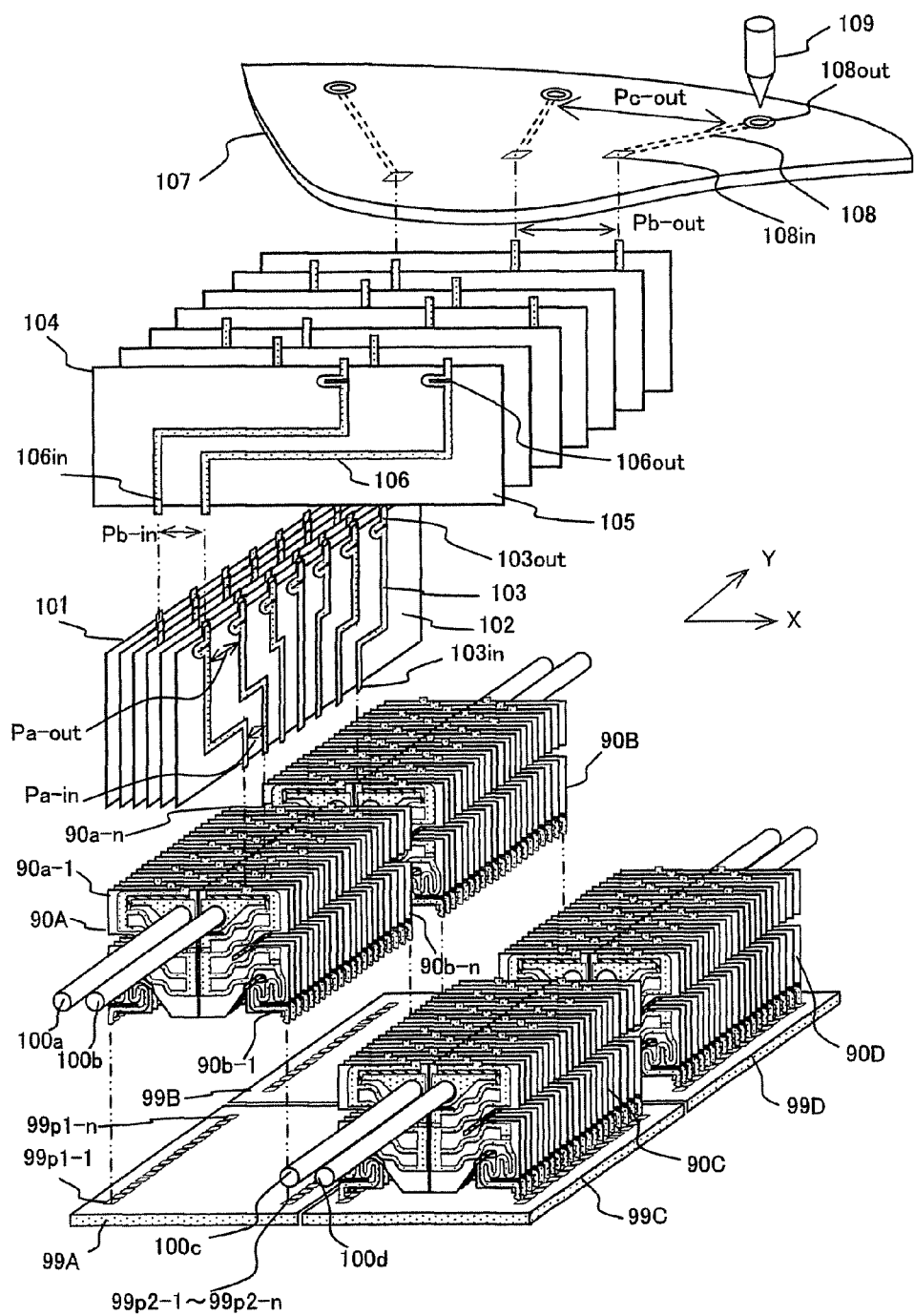
FIG. 12 is a general assembly view of the film-laminated type probe in the seventh embodiment of the present invention.

FIGS. 10 and 11 are schematic side views of a film-laminated type probe according to a seventh embodiment. FIG. 12 is an assembly view schematically showing the entire film-laminated type probe in the seventh embodiment. FIGS. 10 and 11 also show an application of the film-laminated type probe structure described in the second embodiment, which is to further embody the sixth embodiment.

In FIG. 10, conductive parallel beams 91a, 91b, 91c, 91d, conductive vertical beams 92a, 92b, 92c, 92d, 92e, a Zθ deformed portion 93, a signal line terminal portion 92f, and an enhanced conductive dummy portion 96 are all formed by attaching copper foil (e.g., beryllium copper) onto a resin film (e.g., polyimide resin) 88 and by etching the copper foil. Further, an insulating dummy portion 97a is formed by printing insulating resin in a space between the conductive vertical beam 92a and signal line terminal portion 92f, and the enhanced conductive dummy portion 96. The resin film 88 has a hole 95 into which a support rod is inserted to fix plural resin films described below, as well as cuts 94a, 94b, 94c, 94d, in advance.

FIG. 11 is a view showing the placement relationship of a film-laminated type probe, an LSI chip 99 to be inspected, and an inspection circuit 98. A film-laminated type probe 90a configured as described above and a film-laminated type probe 90b having a substantially symmetrical configuration, are arranged in parallel as shown in the figure. The film-laminated type probes 90a, 90b are connected to pads 99p1, 99p2 of the LSI chip 99 to be inspected as well as to pads 90p-i on the board of the inspection circuit 98, and then an inspection is performed. The positions of the signal line terminal portions 92f can be set in advance in line with the positions of the pads 98p-i, respectively. The embodiment describes an example in which the signal line terminal portion 92f is directly connected to the pad 98p-i on the board of the inspection circuit 98. However, the signal line terminal portion 92f may be connected to a relay wiring board which will be described below with reference to FIG. 12.

Referring to the drawing, description will be made on the function and movement in the film-laminated type probe 90a configured as described above. A first parallel spring is formed by the parallel beams 91a, 91b as well as by the vertical beams 92a, 92b. Similarly, a second parallel spring is formed by the parallel beams 91c, 91d as well as by the vertical beams 92c, 92d. The vertical beams 92b and 92d are connected by the vertical beam 92e. The vertical beam 92c has an end in which a zθ deformed portion is formed to establish electrical continuity between the probe end portion 93a and the pad 99p1 and the like of the LSI chip to be inspected. Because the cut 94d is provided, the probe end portion 93a starts rotating about the rotation center 93b when the contact with the pad 99p1 and the like starts and as pushing pressure progresses. Because the cuts 94a, 94b, 94c are provided, the first and second parallel springs form a z deformed portion in which the deformation in the z direction starts as the pushing pressure with the pad 99p1 and the like progresses. In the embodiment, the parallel beams 91a to 91d all have a curved shape, but may have a linear shape or other curved shape according to the deformation amount other factors of the parallel springs.

FIG. 12 is a general assembly view of the film-laminated type probe having the above described function. An LSI chip 99A has n pads 99p1-1 to 99p1-n on one side and n pads 99p2-1 to 99p2-n on the other side. In relation to the LSI chip 99A, a film-laminated type probe assembly 90A is formed by laminating film-laminated type probes 90a-1 to 90a-n and 90b-1 to 90b-n each corresponding to the pads arranged as described above, and by inserting support rods 100a, 100b into the laminated probes. Similarly, a film-laminated type probe assembly 90B is formed in relation to an LSI chip 99B, a film-laminated type probe assembly 90C is formed in relation to an LSI chip 99C, and a film-laminated type probe assembly 90D is formed in relation to an LSI chip 99D. The four film-laminated type probe assemblies are fixed together (not shown) to form a probe assembly available for four chips.

The figure also shows an example in which the probe assembly is connected to an inspection apparatus printed board 107 via a y-direction wiring group 101 and an x-direction wiring group 104. The y-direction wiring group 101 is formed by wiring conductors 103 on a resin film 102. The y-direction wiring group 101 has input portions 103 in that are arranged in line with a pitch Pa-in of plural signal line terminal portions 92f on one straight line selected in the film-laminated type probe assembly 90A. The input portions 103 in are formed so as to slightly protrude from the resin film 102. The pitch of each conductor pattern is extended in the y direction in a process to reach each of the output portions 103 out of the y-direction wiring group to form an output terminal having a pitch Pa-out. The output portions 103 out of the y-direction wiring group are also formed so as to slightly protrude from the resin film 102.

Similarly, an x-direction wiring group 104 is formed by wiring conductors 106 on a resin film 105. The x-direction wiring group 104 has input portions 106 in that are arranged in line with a pitch Pb-in of the output portions 103 out of plural y-direction wiring groups on one straight line selected in the plural y-direction wiring groups 101. The input portions 106 in are formed so as to slightly protrude from the resin film 105. The pitch of each conductor pattern is extended in the x direction in a process to reach each of the output portions 106 out of the x-direction wiring group. Finally, an output terminal is formed to have a pitch Pb-out matching the pitch of the input terminal 108 in of the inspection apparatus printed board. The output portions 106 out of the x-direction wiring group are also formed so as to slightly protrude from the resin film 104.

The y-direction wiring groups 101 and x-direction wiring groups 104, which are formed as described above, are laminated and fixed respectively. The film-laminated type probe assembly 90A and the y-direction wiring groups 101, the y-direction wiring groups 101 and the x-direction wiring groups 104, and the x-direction wiring groups 104 and the inspection apparatus printed board 107 are brought into contact with each other at their input/output terminals which are formed so as to slightly protrude from the resin films, respectively. In this way, electrical continuity can be established.

On the inspection printed board 107, each wiring is further guided from an input terminal 108 in of the inspection apparatus printed board to an output terminal 108 out thereof having a standard pitch Pc-out by a conductive pattern 108. The wiring is brought into contact with a pogo pin 109 of the inspection apparatus, and then an inspection is performed.

By employing the two-stage parallel spring structure and the film-laminated type probe as described in the embodiment, it is possible to configure a small probe available for all pads of one LSI chip within the area of the LSI chip. Thus, by connecting plural film-laminated type probe groups having the same configuration, it is possible to realize a probe assembly available for all pads on one wafer. Although the embodiment shows an example in which n pads are evenly arranged in a linear array in both ends of the LSI chip, the present invention can be applied to the pads arranged in a zigzag pattern or other non-grid pattern by changing or partially removing the positions of the probe end portions 93a.

Further, the present invention is applicable not only to the high density and narrow pitch pads but also to a design for an existing inspection apparatus board because the high density wirings in the vicinity of the pads can be gradually extended to a rough pitch of the input portions of the existing inspection apparatus board. In addition, the input terminal positions of the inspection apparatus board can be arbitrary designed, so that it is possible to realize a board having fewer layers than the existing multi-layer (several tens of layers) board. As a result, a low-cost probe device can be provided.

Eighth Embodiment

Figure 13:
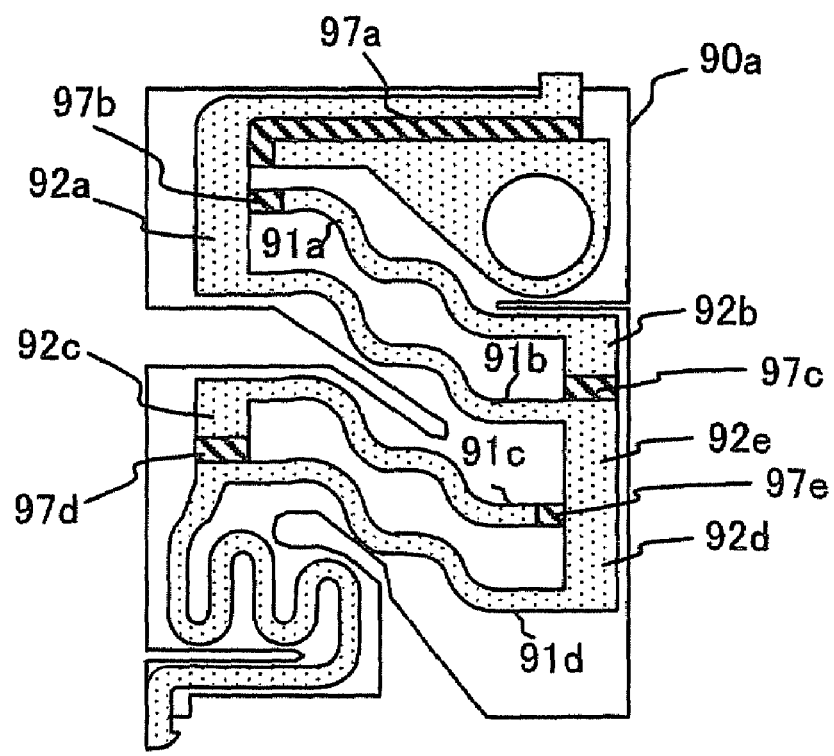
FIG. 13 is a schematic side view of the film-laminated type probe, showing an eighth embodiment of the present invention.
Figure 14:
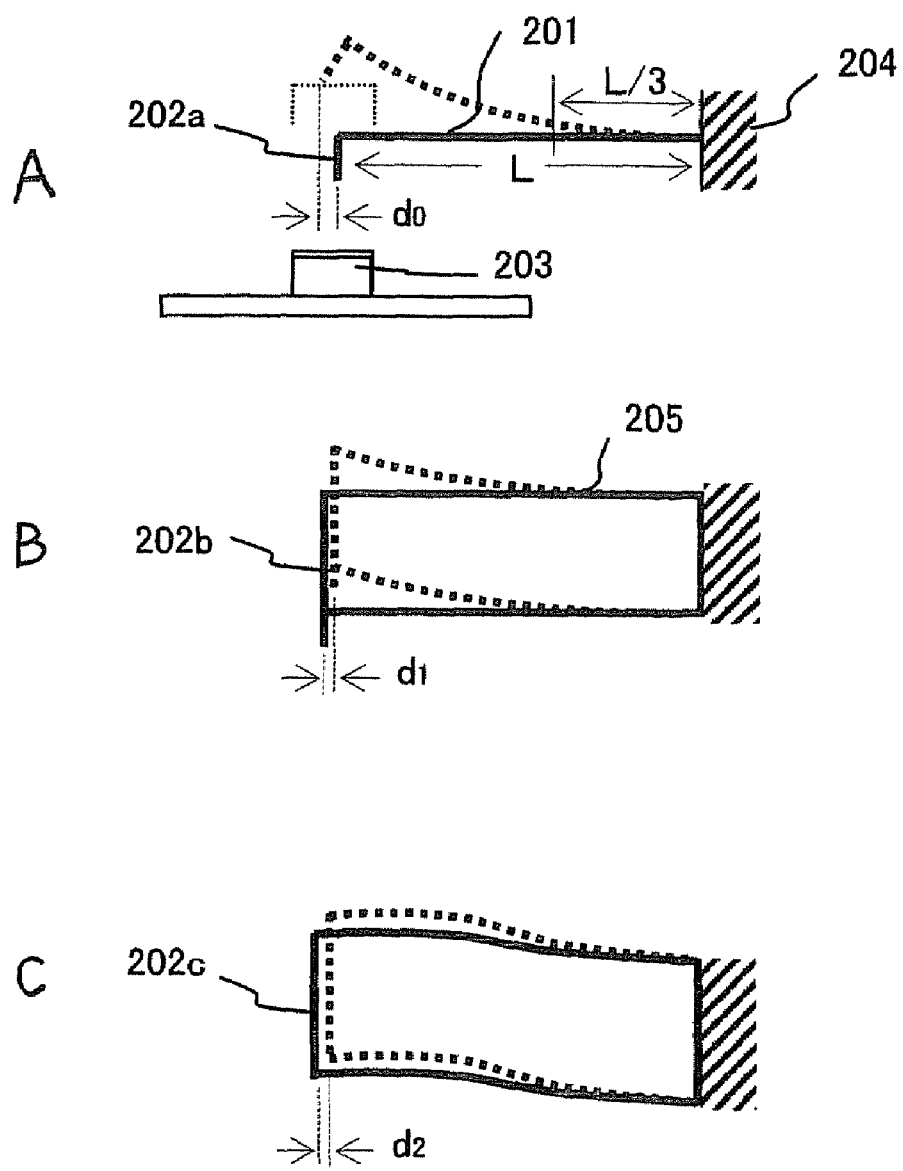
FIGS. 14A, 14B, 14C are basic views of the cantilever structure and parallel spring structure, showing a conventional embodiment.
Figure 15:
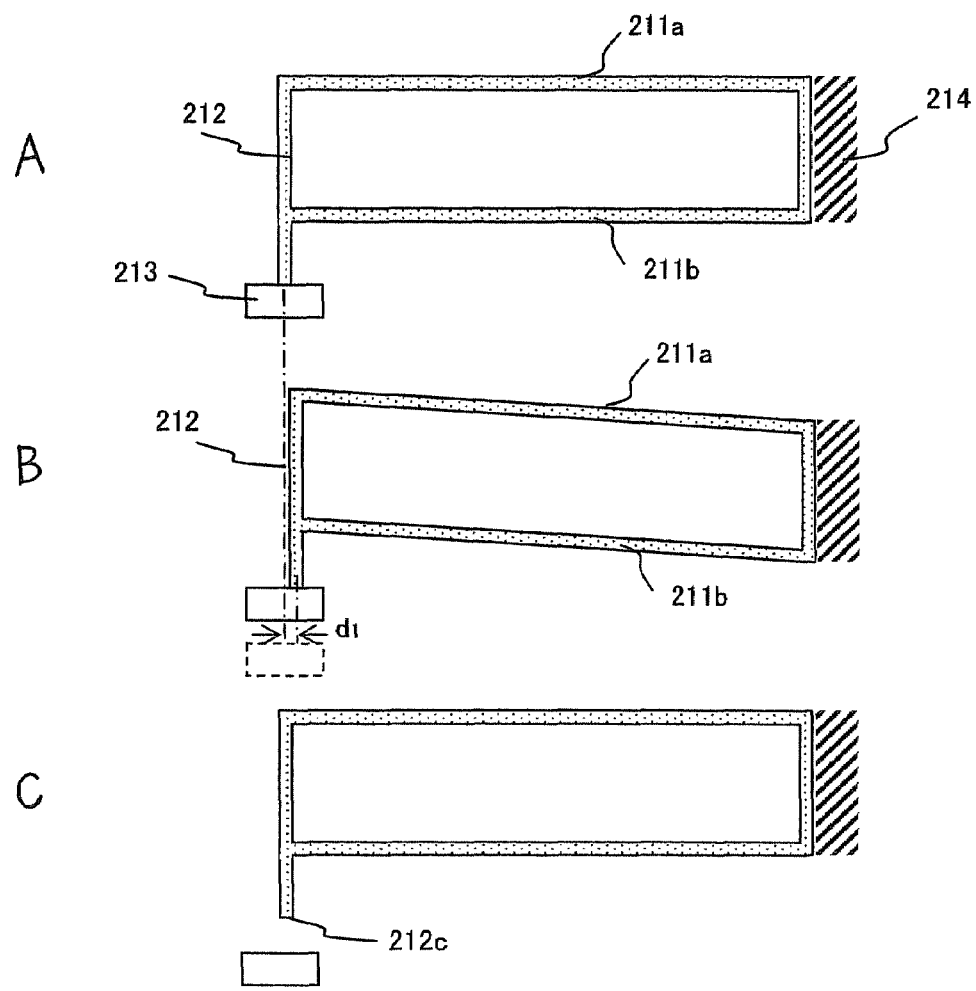
FIGS. 15A, 15B, 15C are schematic side views showing the conventional embodiment of the parallel spring structure, respectively showing the movement of the probe end portion.

FIG. 13 is a schematic side view of a film-laminated type probe, showing an eighth embodiment. In the film-laminated type probe 90a, portions of the vertical beams and parallel beams are formed by printing insulating resin, instead of using the conductive material, to serve as insulating dummy portions 97b, 97c, 97d, and 97e. In this way, electrical continuity between the parallel beam 91a and vertical beam 92b, and the parallel beam 91c and vertical beam 92c is broken. As a result, the conductive portion has a small capacitance. Meanwhile the insulating dummy portions 97b, 97c, 97d, 97e maintain rigidity by the insulating resin. As a result, the probe mechanically has a function of the parallel spring. Thus, it is possible to provide a probe that can inspect a chip with high-speed and high-capacity signals.

As described above, the probe according to the present invention is applicable to the circuit inspection apparatus (prober) that is adapted to the narrowing of pitch of semiconductor devices, without the need for cleaning of the probe end. For example, the probe has a function that can sufficiently follow the batch inspection of a wafer on which dozens to hundreds of semiconductor chips are formed with a diameter of 300 mm.

The present invention has been described based on preferred embodiments shown in the drawings. However, it will be apparent to those skilled in the art that various changes and modifications can be added without departing from the sprit of the present invention. The present invention includes such variations.

What is claimed is:

1. A probe comprising:
    a z deformed portion that is elastically deformed at least in a vertical direction; and
    a zθ deformed portion that is serially connected to the z deformed portion, the zθ deformed portion rotating while being elastically deformed at least in the vertical direction;
    wherein the z deformed portion includes:
        first and second pairs of parallel springs each having two substantially parallel beams of electrically conductive material formed by curves, straight lines, or a curve and a straight line in which the two beams are fixed at both ends thereof by common undeformable supports, the first and second pairs of parallel springs performing translation movement within a certain range when one support of the first pair of parallel springs is fixed and one support of the second pair of parallel springs is moved; and
        means for connecting the first and second pairs of parallel springs, the means comprising a member of electrically conductive material;
    and
    wherein the one support of the first pair of parallel springs is linked to a probe output terminal of the z deformed portion to be electrically coupled to an inspection circuit, and the one support of the second pair of parallel springs is linked to the zθ deformed portion to be electrically coupled to a pad which is a terminal to be measured.

2. The probe according to claim 1, wherein the zθ deformed portion includes:
    one or more rotation centers;
    a curved portion; and
    a probe end connected to the curved portion;
    wherein, when the zθ deformed portion comes into contact with the pad and during overdrive in an inspection,
        the zθ deformed portion rotates about the rotation centers,
        the probe end comes into contact with a pad surface defined by the pad at one point or within a limited range,
        a relative displacement occurs between the pad surface and the probe end, and
        contaminant material is removed in the beginning of the contact, and electrical continuity is established in the second half of the contact.

3. The probe according to claim 1, wherein the zθ deformed portion includes rotation centers $O(0)$, $O(1)$, and $O(n)$; and
    wherein the zθ deformed portion rotates about the rotation centers $O(0)$, $O(1)$, and $O(n)$ so that;
        the respective rotations of the zθ deformed portion about the rotation centers $O(0)$, $O(1)$, and $O(n)$ define respective rotation angles $\theta(1)$, $\theta(2)$, and $\theta(n)$;
        a rotation angle $\theta$ is defined by the sum of the rotation angles $\theta(1)$, $\theta(2)$, and $\theta(n)$; and
        the respective rotations of the zθ deformed portion about the rotation centers $O(0)$, $O(1)$, and $O(n)$ define respective z direction displacements $z(1)$, $z(2)$, and $z(n)$ of the zθ deformed portion,
        in a profile curve of contact points between the zθ deformed portion and the pad, one of vertices $P(0)$, $P(1)$, and $P(n)$ of line segments $S(1)$, $S(2)$, and $S(n)$ corresponding to the respective rotation angles $\theta(1)$, $\theta(2)$, and $\theta(n)$, comes into contact with a surface of the pad, and
        when one of the line segments $S(1)$, $S(2)$, and $S(n)$ including the contacting vertex is substantially in parallel to the surface of the pad, a convex curve of the vertices $P(0)$, $P(1)$, and $P(n)$ that are connected by a continuous smooth curve is included in a portion of the end shape of the zθ deformed portion.

4. The probe according to claim 1, further comprising:
    another z deformed portion that is elastically deformed at least in the vertical direction, the another z deformed portion including another probe output terminal, the respective probe output terminals of the z deformed portions defining a probe output terminal pitch;
    a first wiring group to which the probe output terminals are electrically coupled, the first wiring group including: input terminals having an input terminal pitch equal to the probe output terminal pitch; and output terminals having an output terminal pitch larger than the input terminal pitch of the first wiring group in a first horizontal direction, and
    a second wiring group to which the output terminals of the first wiring group are electrically coupled, the second wiring group including: input terminals having an input terminal pitch equal to the output terminal pitch of the first wiring group; and output terminals having an output terminal pitch larger than the input terminal pitch of the second wiring group in a second horizontal direction perpendicular to the first horizontal direction.

5. The probe according to claim 4,
    wherein each wiring of the first and second wiring groups is formed on a resin film, and
    the input terminals and output terminals of the wiring groups are protruding from an outer periphery of the resin films.

6. The probe according to claim 4, further comprising one or more other probe output terminals;
    wherein the probe output terminals are arranged on a straight line, and are electrically coupled to the first wiring group.

7. The probe according to claim 4, further comprising one or more other first wiring groups having output terminals;
    wherein the output terminals of the first wiring groups are arranged on a straight line, and are electrically coupled to the second wiring group.

* * * * *